United States Patent
Jung et al.

(10) Patent No.: US 10,069,495 B2
(45) Date of Patent: Sep. 4, 2018

(54) SEMICONDUCTOR MEMORY DEVICE FOR CALIBRATING A TERMINATION RESISTANCE AND A METHOD OF CALIBRATING THE TERMINATION RESISTANCE THEREOF

(71) Applicant: SAMSUNG ELECTRONICS CO., LTD., Suwon-si, Gyeonggi-do (KR)

(72) Inventors: Hangi Jung, Hwaseong-si (KR); Hun-Dae Choi, Seoul (KR); Jinhyeok Baek, Busan (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/594,107

(22) Filed: May 12, 2017

(65) Prior Publication Data

US 2017/0366183 A1    Dec. 21, 2017

(30) Foreign Application Priority Data

Jun. 20, 2016   (KR) .................. 10-2016-0076702

(51) Int. Cl.
  *H03K 17/16*   (2006.01)
  *H03K 19/003*  (2006.01)
  (Continued)

(52) U.S. Cl.
  CPC ...... *H03K 19/0005* (2013.01); *G11C 11/4074* (2013.01); *G11C 11/4085* (2013.01); *G11C 11/4093* (2013.01); *G11C 11/4099* (2013.01); *G11C 29/025* (2013.01); *G11C 29/028* (2013.01); *G11C 29/50008* (2013.01);
  (Continued)

(58) Field of Classification Search
  None
  See application file for complete search history.

(56) References Cited

U.S. PATENT DOCUMENTS 7,295,033 B2   11/2007   Chung et al.
7,579,861 B2    8/2009   Shin et al.
(Continued)

FOREIGN PATENT DOCUMENTS

KR   10-0699828   3/2007
KR   10-0974225   8/2010
KR   10-1053660   8/2011

OTHER PUBLICATIONS

Shin, Jun-Hee et al., "Methodology on Power Estimation of Memory Modules With Pseudo-Open Drain and Center-Tab Termination Type Termination Schemes", Samsung Electronics, Nov. 2011.

*Primary Examiner* — Anh Tran
(74) *Attorney, Agent, or Firm* — F. Chau & Associates, LLC

(57) ABSTRACT

A memory device includes a first on-die termination circuit, a second on-die termination circuit, a voltage generator, and a code generator. The first on-die termination circuit may correspond to a data input buffer. The second on-die termination circuit may correspond to a command/address buffer. The voltage generator may generate a reference voltage. The code generator may generate a resistance calibration code of a selected one of the on-die termination circuits in response to the reference voltage. The reference calibration code may calibrate a resistance value of the selected on-die termination circuit.

20 Claims, 13 Drawing Sheets

(51) Int. Cl.

| | |
|---|---|
| *H03K 19/00* | (2006.01) |
| *G11C 11/4074* | (2006.01) |
| *G11C 11/4099* | (2006.01) |
| *G11C 11/4093* | (2006.01) |
| *G11C 29/02* | (2006.01) |
| *G11C 29/50* | (2006.01) |
| *G11C 11/4076* | (2006.01) |
| *G11C 11/408* | (2006.01) |

(52) U.S. Cl.
CPC ....... *G11C 11/4076* (2013.01); *G11C 11/4082* (2013.01); *G11C 2207/105* (2013.01)

(56) References Cited

U.S. PATENT DOCUMENTS

| | | |
|---|---|---|
| 8,274,308 B2 | 9/2012 | McCall et al. |
| 8,471,590 B2 | 6/2013 | Kang |
| 8,947,962 B2 | 2/2015 | Shaeffer et al. |
| 9,076,515 B2 | 7/2015 | Jeon |
| 9,292,391 B2 | 3/2016 | Ojalvo et al. |
| 2003/0218477 A1* | 11/2003 | Jang ................... H03K 19/0005 326/30 |
| 2010/0001758 A1* | 1/2010 | Dreps ................. G06F 13/4072 326/30 |
| 2013/0138898 A1 | 5/2013 | Osanai et al. |
| 2013/0242680 A1 | 9/2013 | Lee et al. |
| 2013/0257475 A1 | 10/2013 | Kao |
| 2014/0225640 A1* | 8/2014 | Kuroki ........... H03K 19/017545 326/30 |
| 2015/0115999 A1* | 4/2015 | Lee ................ H03K 19/017545 326/30 |
| 2015/0340069 A1 | 11/2015 | Arai et al. |

* cited by examiner

SEMICONDUCTOR MEMORY DEVICE FOR CALIBRATING A TERMINATION RESISTANCE AND A METHOD OF CALIBRATING THE TERMINATION RESISTANCE THEREOF

CROSS-REFERENCE TO RELATED APPLICATION

This U.S. non-provisional patent application claims priority under 35 U.S.C. § 119 to Korean Patent Application No. 10-2016-0076702, filed on Jun. 20, 2016 in the Korean Intellectual Property Office, the disclosure of which is incorporated by reference herein in its entirety.

TECHNICAL FIELD

Exemplary embodiments of the inventive concept relate to semiconductor memory systems, and more particularly, to a semiconductor memory device for calibrating a termination resistance and a method of calibrating the termination resistance thereof.

DISCUSSION OF RELATED ART

A data signal transmitted along a transmission path of a semiconductor memory system can be reflected at a termination of the transmission path. The reflected data signal becomes noise that affects the original data signal and decreases quality of the original data signal. To prevent reflection of the data signal, a termination resistor is connected to the termination, e.g., end, of the transmission path.

The termination resistor can reduce reflection of the data signal and prevent quality degradation of the data signal by matching an impedance of the inside of the semiconductor memory system with an impedance of the outside of the semiconductor memory system. A termination circuit including the termination resistor may be used in a dynamic random access memory (DRAM) having a high operation speed. An on-die termination technology, which connects the termination resistor to the inside of the DRAM, may be used to prevent signal interference between DRAMs.

SUMMARY

According to an exemplary embodiment of the inventive concept, a memory device includes a first on-die termination circuit, a second on-die termination circuit, a voltage generator, and a code generator. The first on-die termination circuit may correspond to a data input buffer. The second on-die termination circuit may correspond to a command/address buffer. The voltage generator may generate a reference voltage. The code generator may generate a resistance calibration code of a selected one of the on-die termination circuits in response to the reference voltage. The resistance calibration code may calibrate a resistance value of the selected on-die termination circuit.

According to an exemplary embodiment of the inventive concept, in a method of generating a resistance calibration code of a memory device for calibrating resistance values of first and second on-die termination circuits, the method includes generating, at a code generator, a first resistance calibration code for the first on-die termination circuit, changing, at the code generator and a voltage generator, a first generation condition of the resistance calibration code to a second generation condition of the resistance calibration code for the second on-die termination circuit, and generating, at the code generator, a second resistance calibration code for the second on-die termination circuit using the second generation condition.

According to an exemplary embodiment of the inventive concept, a termination resistance calibration circuit of a memory device includes a first on-die termination circuit, a second on-die termination circuit, a control circuit, a voltage generator, a code generator, and a code register. The first on-die termination circuit is configured to operate in response to a first resistance calibration code. The second on-die termination circuit is configured to operate in response to a second resistance calibration code. The control circuit is configured to generate an update signal, a first calibration signal, and a second calibration signal in response to a calibration clock signal and a calibration start signal. The voltage generator is configured to generate a reference voltage in response to the first calibration signal and the second calibration signal. The code generator is configured to generate a resistance calibration code in response to the reference voltage. The code register is configured to generate the first resistance calibration code and the second resistance calibration code in response to the resistance calibration code, the first calibration signal, the second calibration signal, and the update signal. The code generator includes a first pull-up set connected to a first node, a second pull-up set connected to a second node and the first pull-up set, a pull-down set connected between the second node and ground, a first comparator configured to compare a first voltage of the first node and the reference voltage, and a second comparator configured to compare a second voltage of the second node and the reference voltage.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EMBODIMENTS

Figure 1:
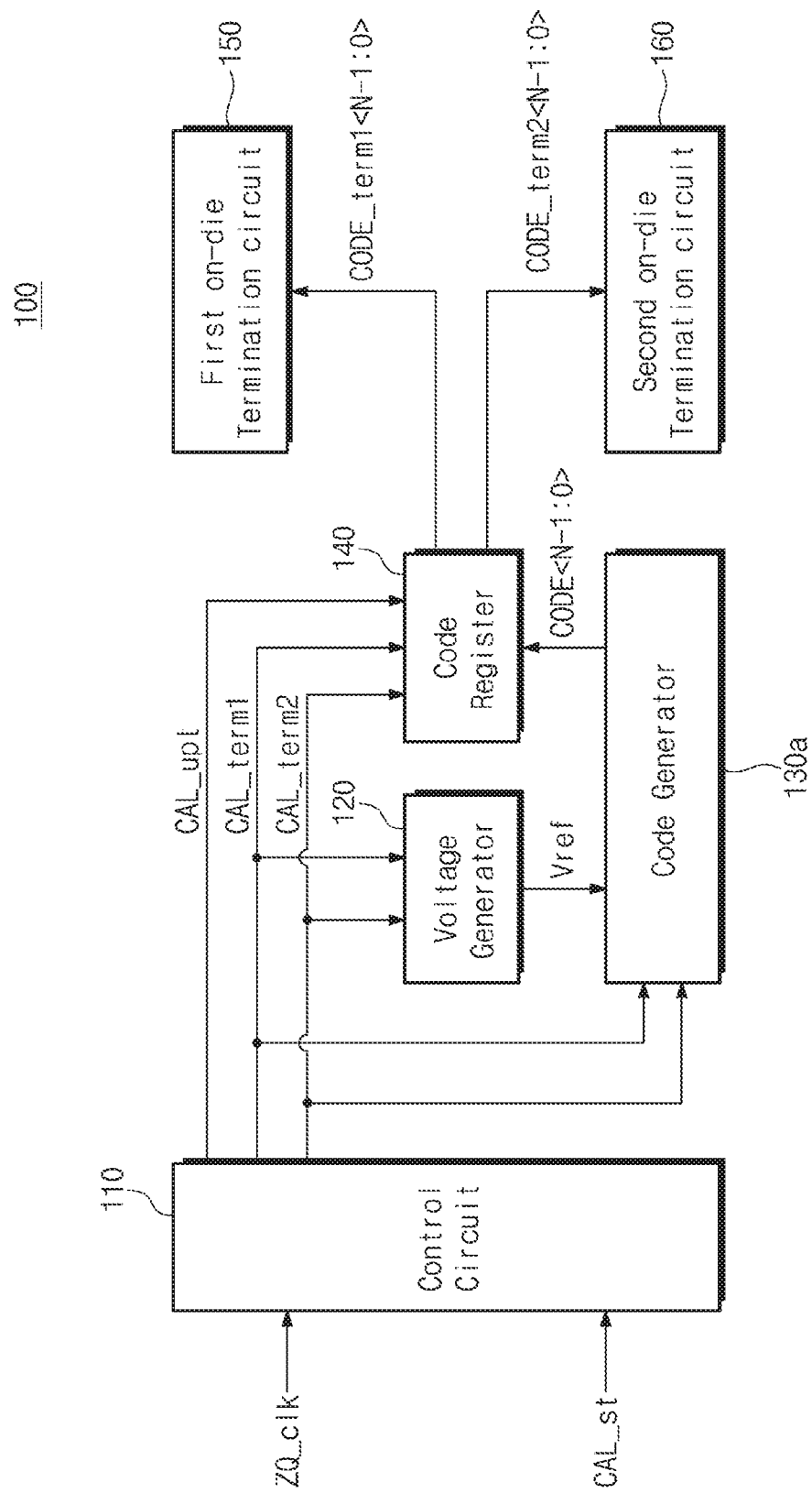
FIG. 1 is a block diagram illustrating a termination resistance calibration circuit according to an exemplary embodiment of the inventive concept.

Exemplary embodiments of the inventive concept will be described more fully hereinafter with reference to the accompanying drawings. Like reference numerals may refer to like elements throughout this application.

FIG. 1 is a block diagram illustrating a termination resistance calibration circuit according to an exemplary embodiment of the inventive concept. The termination resistance calibration circuit 100 is a circuit for calibrating a termination resistance of a memory device. The termination resistance calibration circuit 100 may include a control circuit 110, a voltage generator 120, a code generator 130a, and a code register 140.

The termination resistance calibration circuit 100 may generate a first resistance calibration code (CODE_term1<N-1:0>) and a second resistance calibration code (CODE_term2<N-1:0>). The first resistance calibration code (CODE_term1<N-1:0>) is a code for calibrating a resistance value of a first on-die termination circuit 150. The second resistance calibration code (CODE_term2<N-1:0>) is a code for calibrating a resistance value of a second on-die termination circuit 160. A termination resistor may be connected to a termination of a transmission path to prevent a reflection of a signal and increase quality of the signal. The first and second on-die termination circuits 150 and 160 include termination resistors and are integrated into the memory device.

The first and second on-die termination circuits 150 and 160 may be different types of termination circuits. For example, the first and second on-die termination circuits 150 and 160 may have two different forms, selected among a center tap termination (CTT) form, a pseudo open drain (POD) form, and a ground termination form. The first and second on-die termination circuits 150 and 160 may provide the same resistance value or different resistance values as the termination resistance.

The control circuit 110 may receive a calibration start signal (CAL_st) and a calibration clock signal (ZQ_clk). The calibration start signal (CAL_st) may be generated by a command decoder included in the memory device. The control circuit 110 may start an operation in response to the calibration start signal (CAL_st). The calibration clock signal (ZQ_clk) may be generated by an internal clock signal generator included in the memory device.

The control circuit 110 may generate a first calibration signal (CAL_term1), a second calibration signal (CAL_term2), and an update signal (CAL_upt). The first calibration signal (CAL_term1) is a code that controls the voltage generator 120, the code generator 130a, and the code register 140 to generate the first resistance calibration code (CODE_term1<N-1:0>) and determines a first operation time accordingly. The second calibration signal (CAL_term2) is a code that controls the voltage generator 120, the code generator 130a, and the code register 140 to generate the second resistance calibration code (CODE_term2<N-1:0>) and determines a second operation time accordingly. The first and second calibration signals (CAL_term1, CAL_term2) may be generated by counting the calibration clock signal (ZQ_clk). The update signal (CAL_upt) is a signal that controls the code register 140 to update the first resistance calibration code (CODE_term1<N-1:0>) and the second resistance calibration code (CODE_term2<N-1:0>).

The voltage generator 120 generates a reference voltage Vref having a different level according to the first calibration signal (CAL_term1) or the second calibration signal (CAL_term2). The reference voltage Vref is provided to the code generator 130a. The generated reference voltage Vref may be determined by a termination form of the first and second on-die termination circuits 150 and 160 and a value of the termination resistance.

The code generator 130a generates a resistance calibration code (CODE<N-1:0>) in response to the first calibration signal (CAL_term1) or the second calibration signal (CAL_term2) using the reference voltage Vref. The code generator 130a generates the resistance calibration code (CODE<N-1:0>) with respect to the first on-die termination circuit 150 during the first operation time determined by the first calibration signal (CAL_term1). The code generator 130a also generates the resistance calibration code (CODE<N-1:0>) with respect to the second on-die termination circuit 160 during the second operation time determined by the second calibration signal (CAL_term2). For example, the first operation time may be substantially the same as the second operation time. Alternatively, the first operation time may be different from the second operation time. An operation and configuration of the code generator 130a will be described below with reference to FIGS. 5 through 9.

The code register 140 divides the provided resistance calibration code (CODE<N-1:0) into the first resistance calibration code (CODE_term1<N-1:0>) and the second resistance calibration code (CODE_term2<N-1:0>) according to the first calibration signal (CAL_term1) or the second calibration signal (CAL_term2). An operation and configuration of the code register 140 will be described below with reference to FIG. 10. The resistance calibration code (CODE<N-1:0>) may have N number of bits. Thus, the first resistance calibration code (CODE_term1<N-1:0>) and the second resistance calibration code (CODE_term2<N-1:0>) may also have N number of bits.

Figure 2:
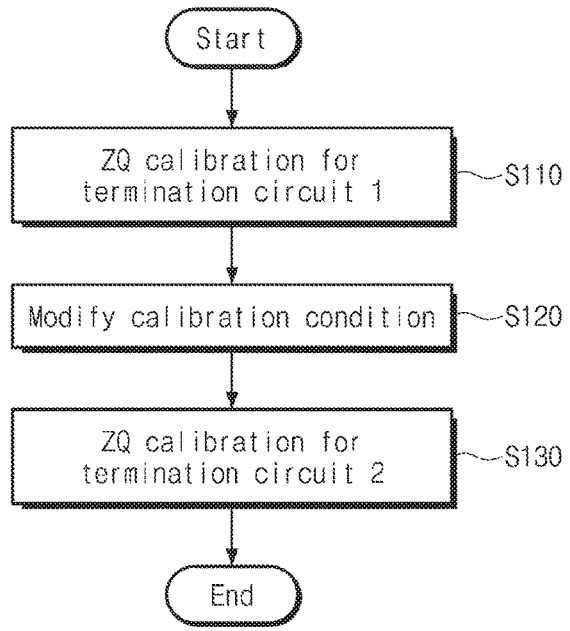
FIG. 2 is a flowchart illustrating an operation of a termination resistance calibration circuit of FIG. 1 according to an exemplary embodiment of the inventive concept.

FIG. 2 is a flowchart illustrating an operation of a termination resistance calibration circuit of FIG. 1 according to an exemplary embodiment of the inventive concept. FIG. 2 will be described with reference to FIG. 1. As described above, the termination resistance calibration circuit 100 may generate the first resistance calibration code (CODE_term1<N-1:0>) and the second resistance calibration code (CODE_term2<N-1:0>).

In an operation S110, ZQ calibration is performed for the first on-die termination circuit 150. The code generator 130a generates the resistance calibration code (CODE<N-1:0>) with respect to the first on-die termination circuit 150 in response to the first calibration signal (CAL_term1). The generated resistance calibration code (CODE<N-1:0>) is provided to the code register 140 and stored therein. Performance time of the operation S110 corresponds to the first operation time described above. During the first operation time, the code generator 130a receives the reference voltage Vref corresponding to the first on-die termination circuit 150, changes a configuration of a pull-up resistance set or a pull-down resistance set included in the code generator 130a to correspond to the first on-die termination circuit 150, and operates with the changed configuration.

In an operation S120, a generation or calibration condition of the resistance calibration code (CODE<N-1:0>) is changed with respect to the second on-die termination circuit 160 in the voltage generator 120 and the code generator 130a in response to the second calibration signal (CAL_term2). In other words, the voltage generator 120 changes the reference voltage Vref to correspond to the second on-die termination circuit 160. The code generator 130a changes a configuration of a pull-up resistance set or a pull-down resistance set included in the code generator 130a to correspond to the second on-die termination circuit 160. For example, in the operation S120 in which the generation condition of the resistance calibration code (CODE<N-1:0>) is changed, to prevent an error, the code generator 130a does not operate to generate the resistance calibration code (CODE<N-1:0>).

In an operation S130, ZQ calibration is performed for the second on-die termination circuit 160. The code generator 130a generates the resistance calibration code (CODE<N-1:0>) with respect to the second on-die termination circuit 160 in response to the activated second calibration signal (CAL_term2) and the changed generation condition of the resistance calibration code (CODE<N-1:0>) (from the operation S120). The generated resistance calibration code (CODE<N-1:0>) is provided to the code register 140 and stored therein. Subsequently, the code register 140 updates the resistance calibration codes (CODE<N-1:0>) generated and stored in the operations S110 and S130, respectively, using the update signal (CAL_upt) and outputs each of the updated resistance calibration codes (CODE<N-1:0>) as the first resistance calibration code (CODE_term1<N-1:0>) and the second resistance calibration code (CODE_term2<N-1:0>), respectively.

The termination resistance calibration circuit 100 may generate the resistance calibration codes (CODE<N-1:0>) with respect to the first and second on-die termination circuits 150 and 160 having heterogeneous termination forms in a single circuit. In other words, according to an exemplary embodiment of the inventive concept, a memory device having a heterogeneous termination circuit or a heterogeneous driver circuit can be implemented.

Figure 3:
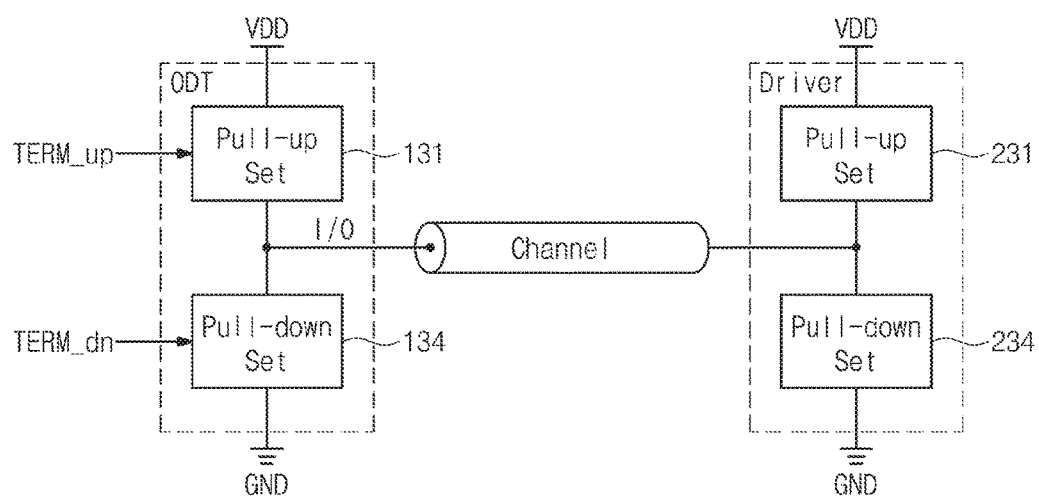
FIG. 3 is a view for explaining a function of a voltage generator illustrated in FIG. 1 according to an exemplary embodiment of the inventive concept.

FIG. 3 is a view for explaining a function of a voltage generator illustrated in FIG. 1 according to an exemplary embodiment of the inventive concept. In FIG. 3, an on-die termination circuit (ODT) and a driver circuit are illustrated. The ODT may include a pull-up set 131 and a pull-down set 134.

The pull-up set 131 is turned on or off by a pull-up termination signal (TERM_up) to provide a pull-up resistance to the ODT. The pull-down set 134 is turned on or off by a pull-down termination signal (TERM_dn) to provide a pull-down resistance to the ODT. It is assumed that the pull-up set 131 and the pull-down set 134 have substantially the same equivalent resistance value. However, the inventive concept is not limited thereto, and the pull-up set 131 and the pull-down set 134 may have different equivalent resistance values. An illustrative configuration of the pull-up set 131 and the pull-down set 134 will be described below with reference to FIGS. 6, 8, and 13.

The driver circuit may be included in a host. The driver circuit transmits data from the host to the ODT, and the pull-up set 231 or the pull-down set 234 may be turned on or off depending on the data transmitted by the driver circuit. The driver circuit may perform a different operation depending on a driving form of the data. It is assumed here that the driver circuit has a driving form of turning on the pull-up set 231 to transmit logic '1' and turning on the pull-down set 234 to transmit logic '0'.

In the case where the ODT has a termination form of POD, only the pull-up set 131 of the on-die termination circuit (ODT) is controlled by the pull-up termination signal (TERM_up) to be operated. In the case where the ODT receives logic '0' from the driver, a drive voltage VDD is resistance-divided by the pull-up set 231 and the pull-down set 134 and thus, half of a level of the drive voltage VDD is provided to a node (I/O). In the case where the ODT receives logic '1' from the driver, the drive voltage VDD is provided to the node (I/O) by the pull-up set 131 of the ODT and the pull-up set 231 of driver. The voltage generator 120 outputs the reference voltage Vref, having a level capable of distinguishing voltages with respect to logic '1' and logic '0' provided to the node (I/O). In this case, the voltage generator 120 outputs four-fifths of the level of the drive voltage VDD as the reference voltage Vref.

In the case where the ODT has a termination form of CTT, the pull-up set 131 and the pull-down set 134 of the on-die termination circuit (ODT) are both controlled by the pull-up termination signal (TERM_up) and the pull-down termination signal (TERM_dn) to be operated. In the case where the ODT receives logic '0' from the driver, the drive voltage VDD is resistance-divided by the pull-up set 231 and the two pull-down sets 134 and 234 and thus, one-thirds of a level of the drive voltage VDD is provided to the node (I/O). In the case where the ODT receives logic '1' from the driver, the drive voltage VDD is resistance-divided by the two pull-up sets 131 and 231 and the pull-down set 134 and thus, two-thirds of the level of the drive voltage VDD is provided to the node (I/O). In this case, the voltage generator 120 outputs half of the level of the drive voltage VDD as the reference voltage Vref.

In the case where the ODT has a termination form of a ground termination, only the pull-down set 134 of the ODT is controlled by the pull-down termination signal (TERM_dn) to be operated. In the case where the ODT receives logic '0' from the driver, a ground voltage GND is provided to the node (I/O) by the two pull-down sets 134 and 234. In the case where the ODT receives logic '1' from the driver, the drive voltage VDD is resistance-divided by the pull-up set 131 and the two pull-down sets 134 and 234 and thus, one-thirds of the level of the drive voltage VDD is provided to the node (I/O). In this case, the voltage generator 120 outputs two-fifths of the level of the drive voltage VDD as the reference voltage Vref.

The aforementioned first and second on-die termination circuits 150 and 160 may correspond the ODT of FIG. 3. In this case, whether a calibration code with respect to the pull-down set 134 or the pull-up set 131 is included in the first resistance calibration code (CODE_term1<N-1:0>) and the second resistance calibration code (CODE_term2<N-1:0>) depends on the termination form and whether the first and second on-die termination circuits 150 and 160 also operate as the driver circuit.

When the ODT operates as the driver circuit, the aforementioned calibration codes may include all the calibration codes with respect to the pull-down set 134 and the pull-up set 131. When the ODT does not operate as the driver circuit, a constitution of the aforementioned calibration codes may be different. For example, in the case where the ODT has the POD form, the aforementioned calibration codes may include only a calibration code with respect to the pull-up set 131. In the case where the ODT has the CTT form, the aforementioned calibration codes may include all the calibration codes with respect to the pull-down set 134 and the pull-up set 131. In the case where the ODT has the ground termination form, the aforementioned calibration codes may include only a calibration code with respect to the pull-down set 134.

For illustrative purposes, it is assumed that the first on-die termination circuit 150 operates as the driver circuit and has the termination form of POD. It is also assumed that the second on-die termination circuit 160 does not operate as the driver circuit and has the termination form of CTT. Accordingly, the resistance calibration code (CODE<N-1:0>), the first resistance calibration code (CODE_term1<N-1:0>), and the second resistance calibration code (CODE_term2<N-1:0>) may include calibration codes with respect to the pull-up set 131 and the pull-down set 134.

Figure 4:
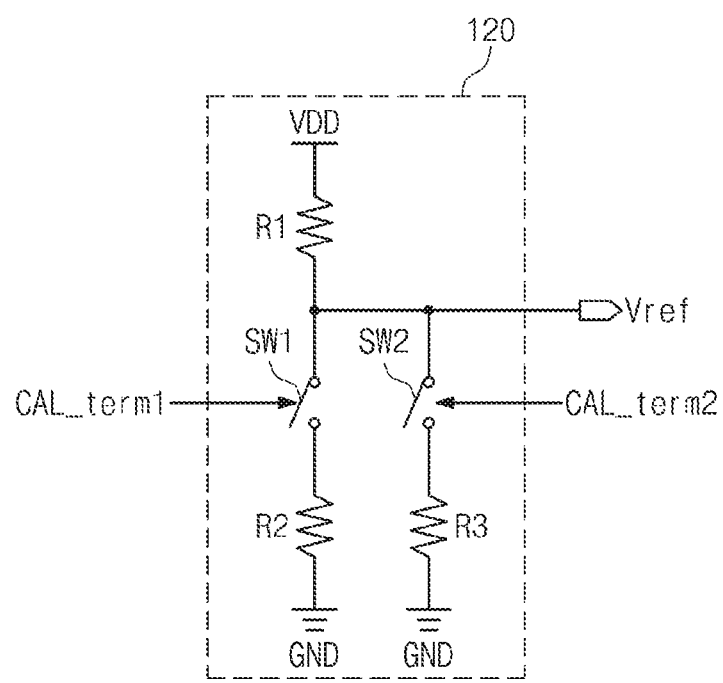
FIG. 4 is a circuit diagram illustrating a voltage generator of FIG. 1 according to an exemplary embodiment of the inventive concept.

FIG. 4 is a circuit diagram illustrating a voltage generator of FIG. 1 according to an exemplary embodiment of the inventive concept. Referring to FIG. 4, the voltage generator 120 may include first through third resistors (R1 to R3) and first and second switches (SW1, SW2). The first resistor R1 may have the same or substantially the same resistance value as the third resistor R3. The second resistor R2 may have a resistance value four times as large as that of the first and third resistors (R1, R3).

The first resistor R1 is connected between the drive voltage VDD and a node Vref (to which the reference voltage Vref is applied). The first switch SW1 and the second resistor R2 are connected in series between the node Vref and the ground voltage GND. The second switch SW2 and the third resistor R3 are connected in series between the node Vref and the ground voltage GND.

In the case where the first calibration signal (CAL_term1) is activated, the first switch (SW1) is turned on and the second switch (SW2) is turned off. Accordingly, the drive voltage VDD is resistance-divided by the first and second resistors R1 and R2 and the voltage generator 120 outputs four-fifths of the level of the drive voltage VDD as the reference voltage Vref. This corresponds to the reference voltage Vref for calibrating the resistance value of the first on-die termination circuit 150 described above.

In the case where the first calibration signal (CAL_term1) is deactivated and the second calibration signal (CAL_term2) is activated, the first switch (SW1) is turned off and the second switch (SW2) is turned on. Accordingly, the drive voltage VDD is resistance-divided by the first and third resistors R1 and R3 and the voltage generator 120 outputs half of the level of the drive voltage VDD as the reference voltage Vref. This corresponds to the reference voltage Vref for calibrating the resistance value of the second on-die termination circuit 160 described above.

Figure 5:
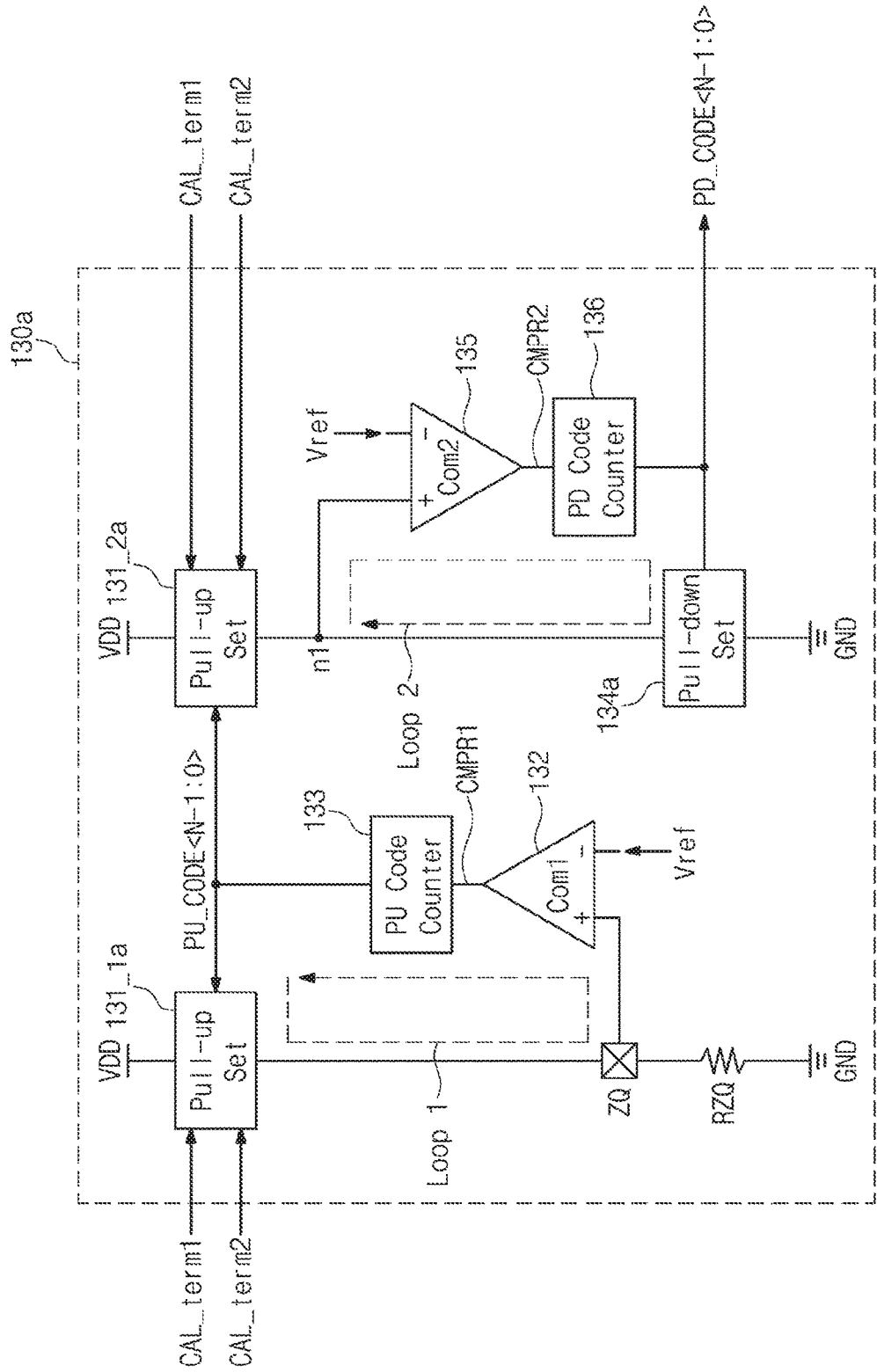
FIG. 5 is a block diagram illustrating a code generator of FIG. 1 according to an exemplary embodiment of the inventive concept.

FIG. 5 is a block diagram illustrating a code generator of FIG. 1 according to an exemplary embodiment of the inventive concept. Referring to FIG. 5, the code generator 130*a* may include a first pull-up set 131_1*a*, a first comparator 132, a pull-up code counter 133, a second pull-up set 131_2*a*, a pull-down set 134*a*, a second comparator 135, and a pull-down code counter 136. The code generator 130*a* may match a termination resistance with a target resistance value based on an external resistor RZQ connected to a ZQ pad and the reference voltage Vref, and may generate the accompanying resistance calibration code (CODE<N-1:0>). The target resistance value may vary depending on the first calibration signal (CAL_term1) or the second calibration signal (CAL_term2). In the present exemplary embodiment, a pull-up target resistance value with respect to the pull-up set 131*a* may be different from a pull-down target resistance value with respect to the pull-down set 134*a*. However, according to exemplary embodiments of the inventive concept, the pull-up target resistance value may be the same or substantially the same as the pull-down target resistance value.

The first pull-up set 131_1*a*, the first comparator 132, and the pull-up code counter 133 constitute a first loop (Loop1). The first loop (Loop1) generates a pull-up code (PU_CODE<N-1:0>) with respect to a termination resistance that matches with the pull-up target resistance value. A resistance value of the first pull-up set 131_1*a* sequentially varies according to the pull-up code (PU_CODE<N-1:0>). A target resistance value of the first pull-up set 131_1*a* may be changed depending on the first calibration signal (CAL_term1) or the second calibration signal (CAL_term2). This will be described below with reference to FIG. 6. The first pull-up set 131_1*a* performs a resistance-dividing operation on the drive voltage VDD together with the external resistor RZQ to provide a voltage to the ZQ pad.

The first comparator 132 may generate a first comparison signal CMPR1. The first comparison signal CMPR1 may be generated using a comparison result of the reference voltage Vref and the voltage of the ZQ pad. The first comparison signal CMPR1 may have a different value depending on whether or not the reference voltage Vref is greater than the voltage of the ZQ pad. The pull-up code counter 133 increases or decreases a value of the pull-up code (PU_CODE<N-1:0>) according to the first comparison signal CMPR1 to match the resistance value of the pull-up set 131_1*a* with the pull-up target resistance value.

In the case where the voltage of the ZQ pad is higher than the reference voltage Vref, the pull-up code counter 133 may lower the voltage of the ZQ pad by increasing or decreasing the value of the pull-up code (PU_CODE<N-1:0>) to calibrate the resistance value of the pull-up set 131_1*a*. Alternatively, in the case where the voltage of the ZQ pad is lower than the reference voltage Vref, the pull-up code counter 133 may increase the voltage of the ZQ pad by increasing or decreasing the value of the pull-up code (PU_CODE<N-1:0>) to calibrate the resistance value of the pull-up set 131_1*a*.

When an operation of the first loop (Loop1) is completed, the resistance value of the pull-up set 131_1*a* may be matched with the pull-up target resistance value. In the case where the resistance value of the pull-up set 131_1*a* is matched with the pull-up target resistance value, the voltage of the ZQ pad is matched with the reference voltage Vref. In this case, an output code value of the pull-up code counter 133 is the pull-up code (PU_CODE<N-1:0>). The outputted pull-up code (PU_CODE<N-1:0>) may calibrate resistance values of the first and second pull-up sets 131_1*a* and 131_2*a*.

The second pull-up set 131_2*a*, the pull-down set 134*a*, the second comparator 135, and the pull-down code counter 136 may constitute a second loop (Loop2). The second pull-up set 131_2*a* has the same or substantially the same configuration as the first pull-up set 131_1*a*. An operation of the second loop (Loop2) is similar to the operation of the first loop (Loop1). The second loop (Loop2) operates such that an equivalent resistance value of the pull-down set 134*a* is matched with the pull-down target resistance value determined by the pull-up set 131_2a and the reference voltage Vref.

A resistance value of the pull-down set 134a sequentially varies according to a pull-down code (PD_CODE<N-1:0>). Here, according to the present exemplary embodiment, the pull-down set 134a does not receive the first calibration signal (CAL_term1) and the second calibration signal (CAL_term2). However, a configuration of the pull-down set 134a may be different depending on the structure of the first and second termination circuits (e.g., the first and second on-die termination circuits 150 and 160 of FIG. 1). This will be described below with reference to FIGS. 12 through 14. A configuration of the pull-down set 134a according to the exemplary embodiment of FIG. 5 will be described below with reference to FIG. 6. The pull-down set 134a performs a resistance-dividing operation on the drive voltage VDD together with the second pull-up set 131_2a to provide a voltage to a node (n1).

The second comparator 135 may generate a second comparison signal CMPR2. The second comparison signal CMPR2 may have a different value depending on whether or not the reference voltage Vref is greater than a voltage of the node (n1). The pull-down code counter 136 matches a resistance value of the pull-down set 134a with the pull-down target resistance value by increasing or decreasing a value of the pull-down code (PD_CODE<N-1:0>) according to the second comparison signal CMPR2.

An operation of the code generator 130a is as follows. First, a configuration of the first and second pull-up sets 131_1a and 131_2a and the reference voltage Vref are set according to the first calibration signal (CAL_term1). The reference voltage Vref, according to the first calibration signal (CAL_term1), is four-fifths of the level of the drive voltage VDD. Thus, the pull-up target resistance value becomes one-fourths of the resistance value of the external resistor RZQ. The pull-down target resistance value is the same or substantially the same as the resistance value of the external resistor RZQ. Subsequently, the first and second loops (Loop1, Loop2) operate and the pull-up code (PU_CODE<N-1:0>) and the pull-down code (PD_CODE<N-1:0>) with respect to the pull-up target resistance value and the pull-down target resistance value, respectively, are generated. In this case, the calibration code (CODE<N-1:0>) may include both the pull-up code (PU_CODE<N-1:0>) and the pull-down code (PD_CODE<N-1:0>). The generated calibration code (CODE<N-1:0>) is provided to the code register 140.

A configuration of the first and second pull-up sets 131_1a and 131_2a and the reference voltage Vref are set according to the second calibration signal (CAL_term2). The reference voltage Vref according to the second calibration signal (CAL_term2) is half of the level of the drive voltage VDD. Thus, the pull-up target resistance value and the pull-down target resistance value are the same or substantially the same as the resistance value of the external resistor RZQ. Subsequently, the first and second loops (Loop1, Loop2) operate, and the pull-up code (PU_CODE<N-1:0>) and the pull-down code (PD_CODE<N-1:0>) with respect to the pull-up target resistance value and the pull-down target resistance value, respectively, are generated. The calibration code (CODE<N-1:0>) including both the pull-up code (PU_CODE<N-1:0>) and the pull-down code (PD_CODE<N-1:0>) are provided to the code register 140.

Figure 6:
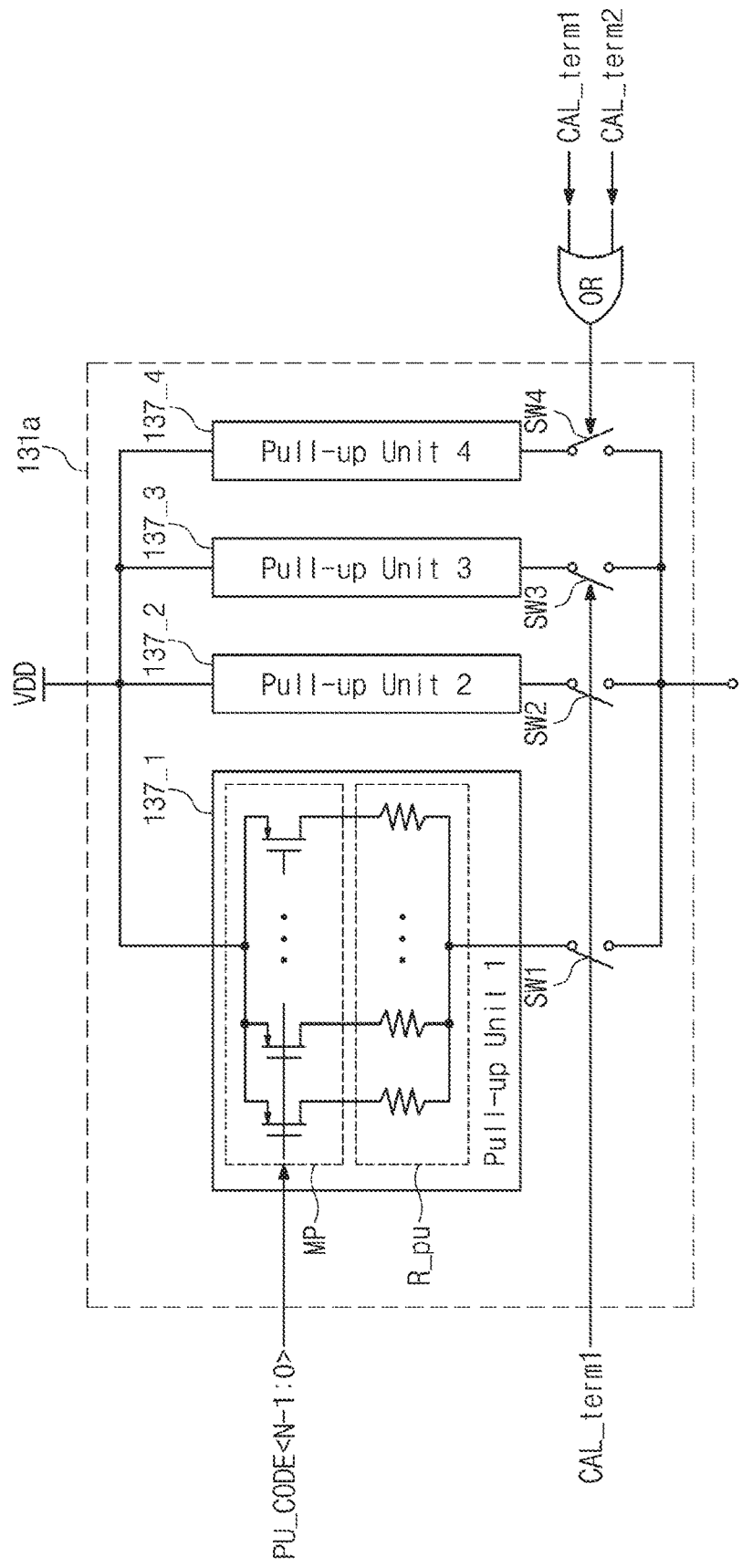
FIG. 6 is a block diagram illustrating a pull-up set of FIG. 5 according to an exemplary embodiment of the inventive concept.

FIG. 6 is a block diagram illustrating a pull-up set of FIG. 5 according to an exemplary embodiment of the inventive concept. Referring to FIG. 6, the pull-up set 131a may include first through fourth pull-up units (137_1 to 137_4), first through fourth switches (SW1 to SW4), and an OR logic. The first through fourth pull-up units (137_1 to 137_4) may have the same or substantially the same configuration.

The first pull-up unit 137_1 may include a plurality of transistors MP. Each of the transistors MP may be turned on or off by the pull-up code (PU_CODE<N-1:0>). For example, each of the transistors MP may be turned on or off based on each bit value of the pull-up code (PU_CODE<N-1:0>), which has a plurality of bits. In the case where the pull-up code (PU_CODE<N-1:0>) having 6 bits is used, the plurality of transistors MP may include 6 transistors. Each of 6 transistors may be turned on or off by each bit value of pull-up code (PU_CODE<5:0>). The number of bits forming the pull-up code (PU_CODE<N-1:0>) and the number of transistors included in the plurality of transistors MP may be changed. The plurality of transistors MP may be configured to include a plurality of NMOS transistors depending on the termination form or driving form.

A current may or may not flow through each of a plurality of resistors (R_pu) depending on whether each transistor, among the plurality of transistors MP, is turned on or off. Thus, an equivalent resistance value of the pull-up set 131a may be changed. In other words, the equivalent resistance value of the pull-up set 131a may be changed by the pull-up code (PU_CODE<5:0>).

The first through fourth pull-up units (137_1 to 137_4) may be connected in series to the first through fourth switches (SW1 to SW4), respectively. The first through third switches (SW1 to SW3) may be turned on or off by the first calibration signal (CAL_term1). The fourth switch SW4 may be turned on or off by an output value of the OR logic. The OR logic outputs a value obtained by performing a logical OR operation on the first and second calibration signals (CAL_term1, CAL_term2). Consequently, all of the first through fourth pull-up units (137_1 to 137_4) are activated to operate in response to the first calibration signal (CAL_term1). In the case where the first calibration signal (CAL_term1) is deactivated, only the fourth pull-up unit 137_4 is activated in response to the second calibration signal (CAL_term2).

Figure 7:
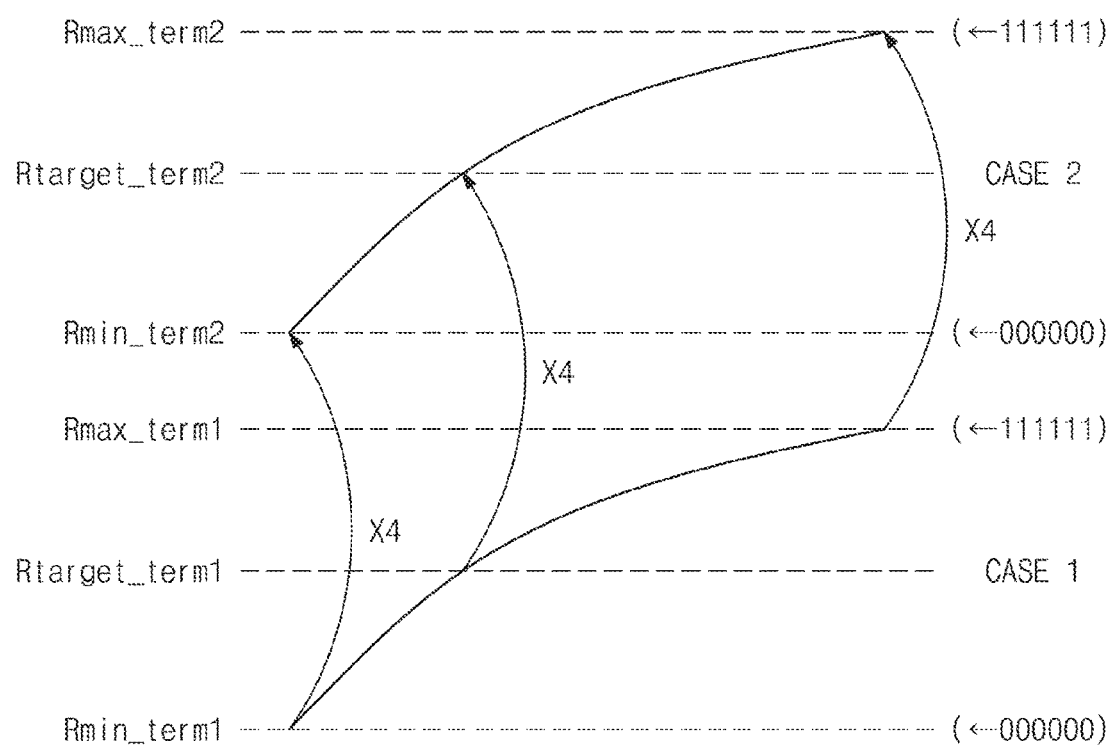
FIG. 7 is a view for explaining a function of a pull-up set of FIG. 6 according to an exemplary embodiment of the inventive concept.

FIG. 7 is a view for explaining a function of a pull-up set of FIG. 6 according to an exemplary embodiment of the inventive concept. FIG. 7 will be described with reference to FIG. 6. As described with reference to FIGS. 5 and 6, the equivalent resistance value of the pull-up set 131a may be changed according to the pull-up code (PU_CODE<N-1:0>).

For illustrative purposes, it is assumed here that the pull-up code (PU_CODE<5:0>) of 6 bits is used. Further, it is assumed that a maximum value (Rmax) of the pull-up set 131a is encoded by the pull-up code (PU_CODE<5:0>) of '111111' and a minimum value (Rmin) of the pull-up set 131a is encoded by the pull-up code (PU_CODE<5:0>) of '000000'. These assumptions are for convenience of description and do not limit the inventive concept.

First, in the case where the first calibration signal (CAL_term1) is activated (CASE1), the equivalent resistance value of the pull-up set 131a sequentially varies from a minimum value (Rmin_term1) to a maximum value (Rmax_term1) according to the pull-up code (PU_CODE<5:0>). A pull-up target resistance value (Rtarget_term1) may exist between the minimum value (Rmin_term1) and the maximum value (Rmax_term2).

After that, in the case where the first calibration signal (CAL_term1) is deactivated and the second calibration signal (CAL_term2) is activated (CASE2), the equivalent resistance value of the pull-up set 131a sequentially varies from the changed minimum value (Rmin_term2) to the changed maximum value (Rmax_term2) according to the pull-up code (PU_CODE<5:0>). In this case, the minimum value (Rmin_term2) and the maximum value (Rmax_term2) may be four times (×4) as large as the minimum value (Rmin_term1) and the maximum value (Rmax_term1), respectively, of CASE1. The equivalent resistance value of the pull-up set 131a may vary according to a change of the reference voltage Vref. In other words, in the case where a source-drain voltage of the pull-up set 131a increases according to the reference voltage Vref, the equivalent resistance value of the pull-up set 131a may increase. Alternatively, in the case where the source-drain voltage of the pull-up set 131a decreases, the equivalent resistance value of the pull-up set 131a may decrease. This behavior may be different depending on a design environment or transistor characteristics. A pull-up target resistance value (Rtarget_term2) may exist between the minimum value (Rmin_term2) and the maximum value (Rmax_term2), and may be four times as large as the pull-up target resistance value (Rtarget_term1) of CASE1.

Figure 8:
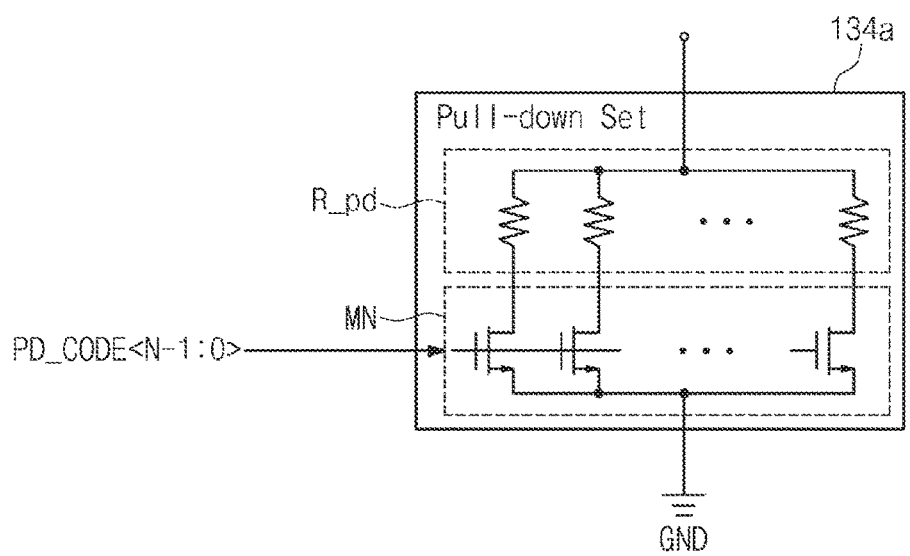
FIG. 8 is a circuit diagram illustrating a pull-down set of FIG. 5 according to an exemplary embodiment of the inventive concept.

FIG. 8 is a circuit diagram illustrating a pull-down set of FIG. 5 according to an exemplary embodiment of the inventive concept. Referring to FIG. 8, the pull-down set 134a may include a plurality of transistors MN.

Each of the transistors MN may be turned on or off by the pull-down code (PD_CODE<N-1:0>). In other words, each of the transistors MN may be turned on or off based on each bit value of the pull-down code (PD_CODE<N-1:0>), which has a plurality of bits. In the case where the pull-down code (PD_CODE<N-1:0>) having 6 bits is used, the plurality of transistors MN may include 6 transistors. Each of 6 transistors may be turned on or off by each bit value of pull-down code (PD_CODE<5:0>). As described in FIG. 6, the number of bits forming the pull-down code (PD_CODE<N-1:0>) and the number of transistors included in the plurality of transistors MN may be changed. The plurality of transistors MN may include a plurality of PMOS transistors depending on the termination form or driving form.

A current may or may not flow through each of a plurality of resistors (R_pd) depending on whether each transistor among the plurality of transistors MN is turned on or off. Thus, an equivalent resistance value of the pull-down set 134a may be changed by the pull-down code (PD_CODE<5:0>).

Figure 9:
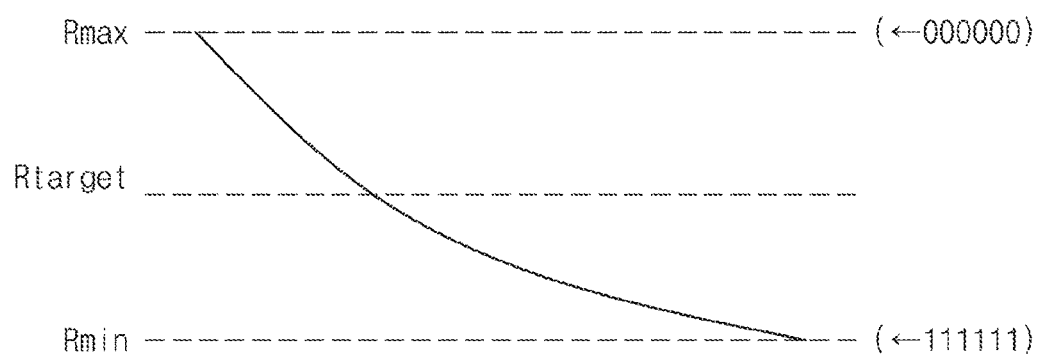
FIG. 9 is a view for explaining a function of a pull-down set of FIG. 8 according to an exemplary embodiment of the inventive concept.

FIG. 9 is a view for explaining a function of a pull-down set of FIG. 8 according to an exemplary embodiment of the inventive concept. FIG. 9 will be described with reference to FIG. 8. As described with reference to FIGS. 5 and 8, the equivalent resistance value of the pull-down set 134a may be changed according to the pull-down code (PD_CODE<N-1:0>).

For illustrative purposes, it is assumed here that the pull-down code (PD_CODE<5:0>) of 6 bits is used. Further, it is assumed that a maximum value (Rmax) of the pull-down set 134a is encoded by the pull-down code (PD_CODE<5:0>) of '000000' and a minimum value (Rmin) of the pull-down set 134a is encoded by the pull-down code (PD_CODE<5:0>) of '111111'. These assumptions are for convenience of description and do not limit the inventive concept.

The equivalent resistance value of the pull-down set 134a sequentially varies from the minimum value (Rmin) to the maximum value (Rmax) according to the pull-down code (PD_CODE<5:0>). The pull-down target resistance value (Rtarget) may exist between the minimum value (Rmin) and the maximum value (Rmax). Unlike the pull-up set 131a, the pull-down set 134a does not receive the first and second calibration signals (CAL_term1, CAL_term2). Thus, in an ideal case, the minimum value (Rmin) and the maximum value (Rmax) of the equivalent resistance value of the pull-down set 134a are not changed according to a change of the first and second calibration signals (CAL_term1, CAL_term2). As described with reference to FIG. 7, the equivalent resistance value of the pull-down set 134a may vary according to a change of the reference voltage Vref and this may be determined by a design environment or transistor characteristics.

Figure 10:
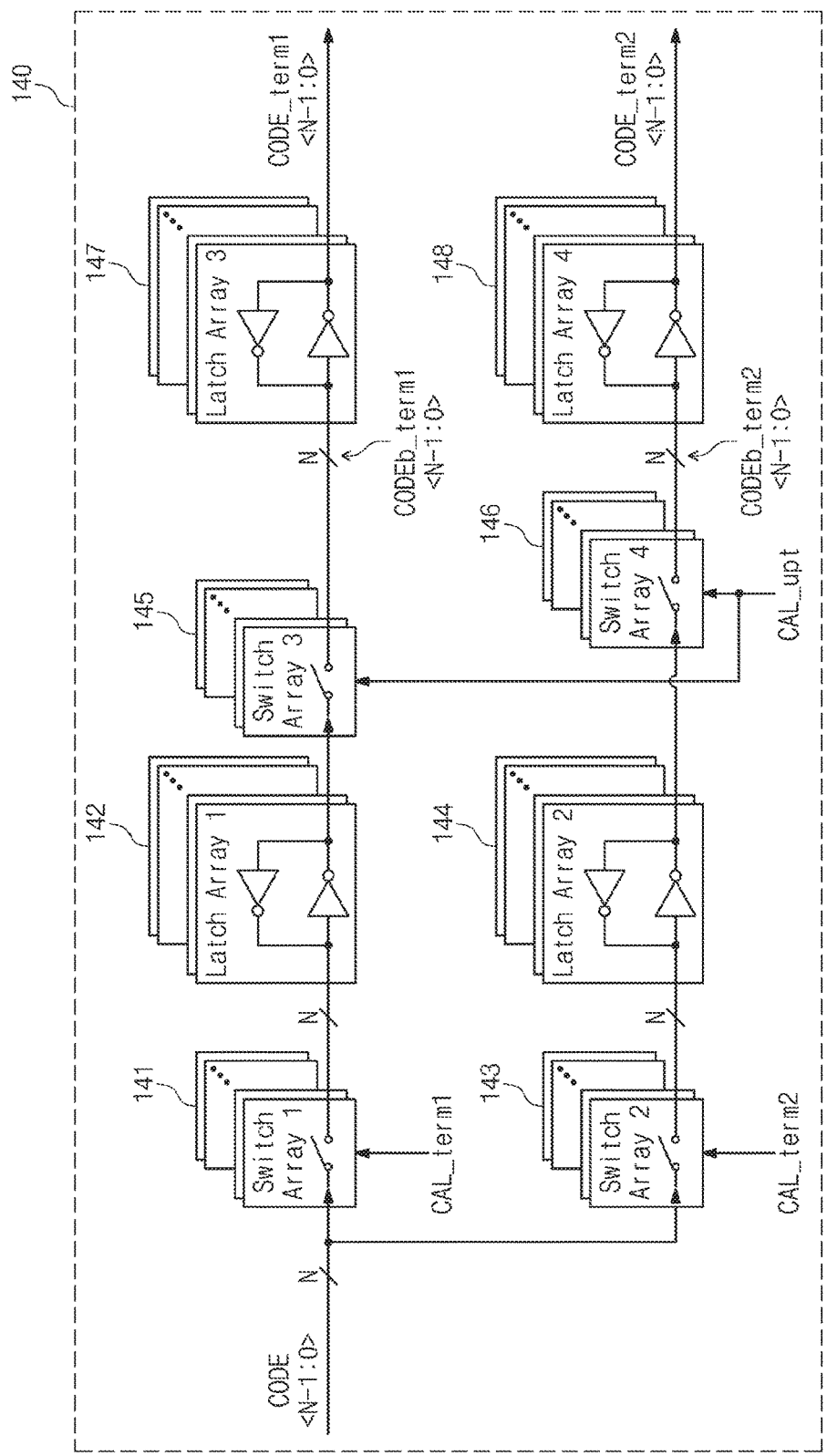
FIG. 10 is a block diagram illustrating a code register of FIG. 1 according to an exemplary embodiment of the inventive concept.

FIG. 10 is a block diagram illustrating a code register of FIG. 1 according to an exemplary embodiment of the inventive concept. Referring to FIG. 10, the code register 140 may include first through fourth switch arrays 141, 143, 145, and 146, and first through fourth latch arrays 142, 144, 147, and 148.

The code register 140 receives the resistance calibration code (CODE<N-1:0>) from the code generator 130a and divides the resistance calibration code (CODE<N-1:0>) into the first resistance calibration code (CODE_term1<N-1:0>) and the second resistance calibration code (CODE_term2<N-1:0>), according to the first and second calibration signals (CAL_term1, CAL_term2), to output them. Each of the first through fourth switch arrays 141, 143, 145, and 146 may include a number of switches corresponding to N, which is the number of bits of the resistance calibration code (CODE<N-1:0>). The first through fourth latch arrays 142, 144, 147, and 148 may include a number of latches corresponding to N.

The first switch array 141 is turned on or off in response to the first calibration signal (CAL_term1) and transmits the resistance calibration code (CODE<N-1:0>), provided from the code generator 130a, to the first latch array 142. The first latch array 142 stores the provided resistance calibration code (CODE<N-1:0>). The stored resistance calibration code (CODE<N-1:0>) is a first complementary code (CODEb_term1<N-1:0>) corresponding to the first on-die termination circuit 150. Here, the first complementary code (CODEb_term1<N-1:0>) is a complementary code of the first resistance calibration code (CODE_term1<N-1:0>).

The second switch array 143 is turned on or off in response to the second calibration signal (CAL_term2) and transmits the provided resistance calibration code (CODE<N-1:0>) to the second latch array 144. The second latch array 144 stores the provided resistance calibration code (CODE<N-1:0>). The stored resistance calibration code (CODE<N-1:0>) is a second complementary code (CODEb_term2<N-1:0>) corresponding to the second on-die termination circuit 160. Here, the second complementary code (CODEb_term2<N-1:0>) is a complementary code of the second resistance calibration code (CODE_term2<N-1:0>). In other words, the resistance calibration code (CODE<N-1:0>) is divided into the first complementary code (CODEb_term1<N-1:0>) and second complementary code (CODEb_term2<N-1:0>) by the first and second switch arrays 141 and 143. The first complementary code (CODEb_term1<N-1:0>) and the second complementary code (CODEb_term2<N-1:0>) are stored in the first and second latch arrays 142 and 144, respectively.

The third and fourth switch arrays 145 and 146 are turned on or off by the update signal (CAL_upt) and transmit the first complementary code (CODEb_term1<N-1:0>) and the second complementary code (CODEb_term2<N-1:0>) stored in the first and second latch arrays 142 and 144, respectively, to the third and fourth latch arrays 147 and 148, respectively. The calibration code stored in the third latch array 147 is output as the first resistance calibration code (CODE_term1<N-1:0>) and the calibration code stored in the fourth latch array 148 is output as the second resistance calibration code (CODE_term2<N-1:0>). In other words, the first resistance calibration code (CODE_term1<N-1:0>) and the second resistance calibration code (CODE_term2<N-1:0>) are updated in response to the update signal (CAL_upt). Even after the resistance calibration operation is completed, a corresponding calibration code value is maintained by the third and fourth latch arrays 147 and 148 and the corresponding calibration code value is provided to the first and second on-die termination circuits 150 and 160.

Figure 11:
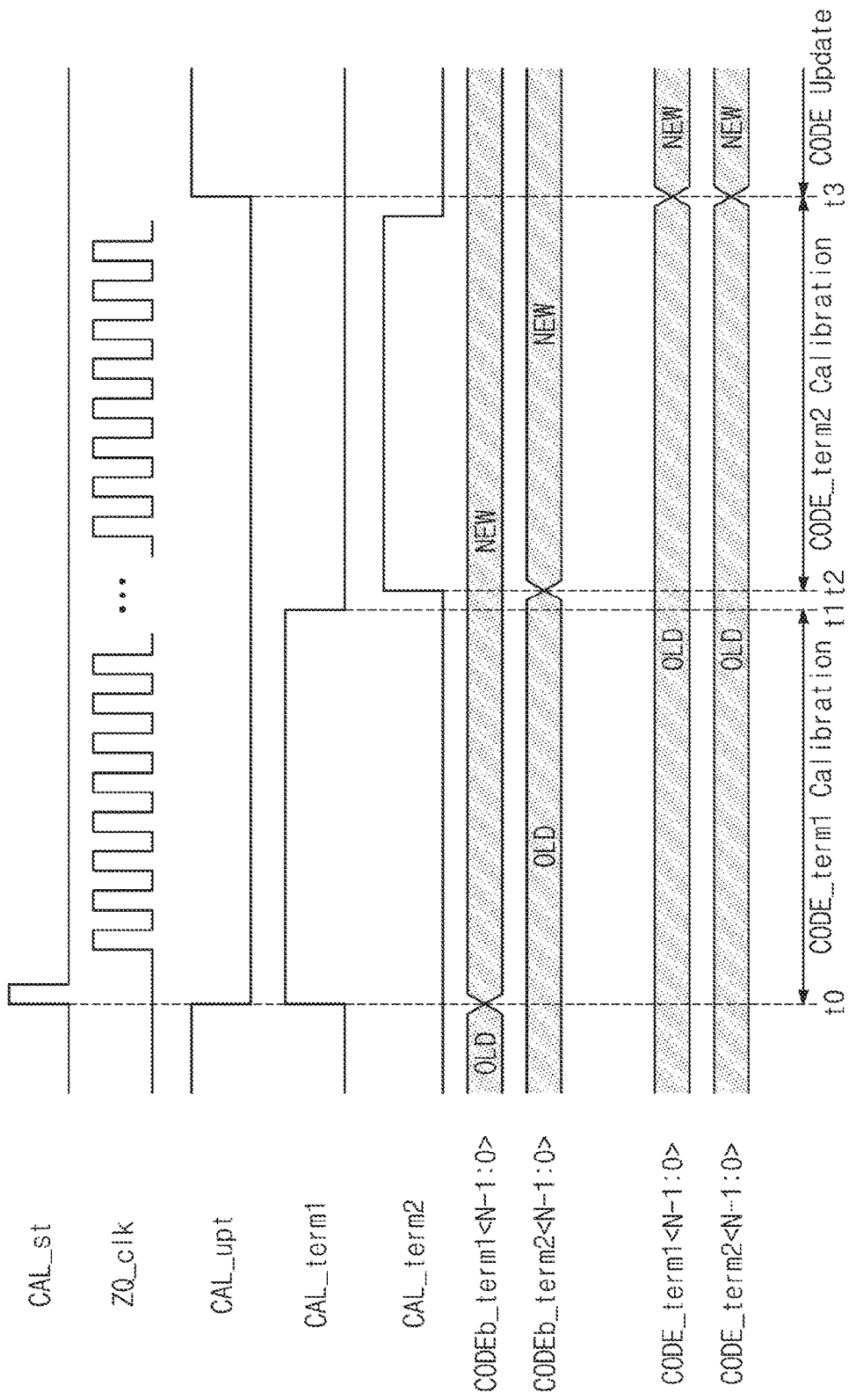
FIG. 11 is a timing diagram illustrating an operation of a termination resistance calibration circuit of FIG. 1 according to an exemplary embodiment of the inventive concept.

FIG. 11 is a timing diagram illustrating an operation of a termination resistance calibration circuit of FIG. 1 according to an exemplary embodiment of the inventive concept. FIG. 11 will be described with reference to FIGS. 1, 5, and 10. The calibration start signal (CAL_st), the calibration clock signal (ZQ_clk), the update signal (CAL_upt), the first and second calibration signals (CAL_term1, CAL_term2), the first and second resistance calibration codes (CODE_term1<N-1:0>, CODE_term2<N-1:0>), and the first and second complementary codes (CODEb_term1<N-1:0>, CODEb_term2<N-1:0>) that are illustrated in FIG. 11 correspond to those described with reference to FIGS. 1 through 10. Thus, a detailed description thereof is omitted.

In t0-t1, the first calibration signal (CAL_term1) is activated and the code generator 130a generates the resistance calibration code (CODE<N-1:0>) with respect to a condition set by the first calibration signal (CAL_term1). The generated resistance calibration code (CODE<N-1:0>) is provided to the code register 140. The first latch array 142 of the code register 140 stores the provided resistance calibration code (CODE<N-1:0>) as the first complementary code (CODEb_term1<N-1:0>). As described with reference to FIG. 1, the first and second calibration signals (CAL_term1, CAL_term2) are generated in response to the calibration start signal (CAL_st) and the calibration clock signal (ZQ_clk).

In t1-t2, the voltage generator 120 and the code generator 130a change a generation condition of the resistance calibration code (CODE<N-1:0>) to correspond to the second on-die termination circuit 160. As described above, in t1-t2, to prevent a generation error of the resistance calibration code (CODE<N-1:0>), the code generator 130a does not perform a calibration operation on the resistance calibration code (CODE<N-1:0>).

In t2-t3, the first calibration signal (CAL_term1) is deactivated, the second calibration signal (CAL_term2) is activated, and the code generator 130a generates the resistance calibration code (CODE<N-1:0>) with respect to a condition set by the second calibration signal (CAL_term2). The generated resistance calibration code (CODE<N-1:0>) is provided to the code register 140. The second latch array 144 of the code register 140 stores the provided resistance calibration code (CODE<N-1:0>) as the second complementary code (CODEb_term2<N-1:0>).

At t3, the update signal (CAL_upt) is activated and then, the first and second resistance calibration codes (CODE_term1<N-1:0>, CODE_term2<N-1:0>) are updated. Consequently, generation of new resistance calibration codes with respect to the first and second on-die termination circuits 150 and 160 is completed.

Figure 12:
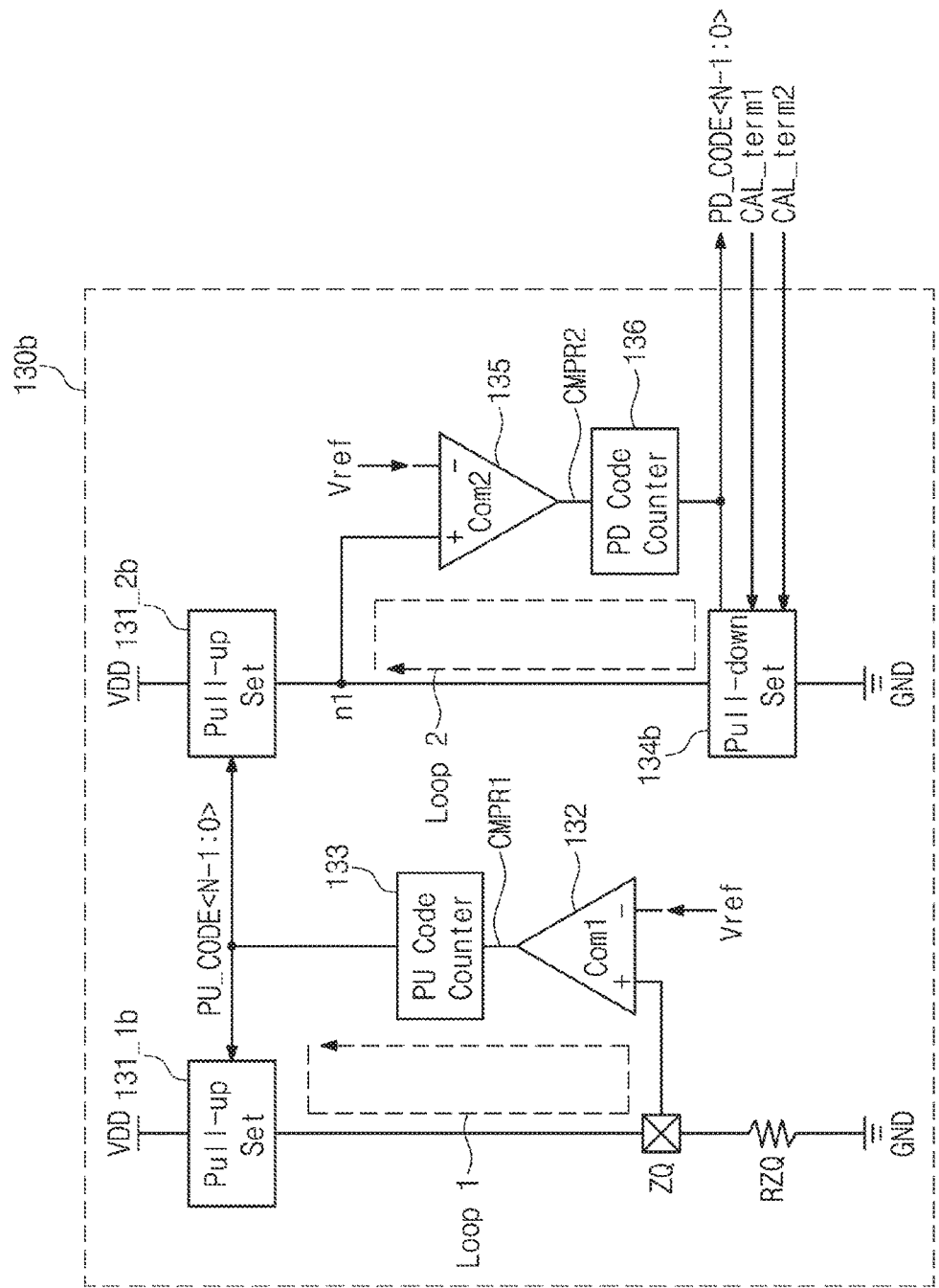
FIG. 12 is a block diagram illustrating a code generator according to an exemplary embodiment of the inventive concept.

FIG. 12 is a block diagram illustrating a code generator according to an exemplary embodiment of the inventive concept. Referring to FIG. 12, a code generator 130b may include a first pull-up set 131_1b, the first comparator 132, the pull-up code counter 133, a second pull-up set 131_2b, a pull-down set 134b, the second comparator 135, and the pull-down code counter 136. A configuration and operation of the code generator 130b of FIG. 12 is the same or substantially the same as that of the code generator 130a of FIG. 5, except that the first and second pull-up sets (131_1b, 131_2b) are not controlled by the first and second calibration signals (CAL_term1, CAL_term2) but the pull-down set 134b is controlled by the first and second calibration signals (CAL_term1, CAL_term2). Thus, a detailed description of similar elements is omitted. Each of the first and second pull-up sets (131_1b, 131_2b) may include a single pull-up unit.

The code generator 130b may generate the resistance calibration code (CODE<N-1:0>) with respect to the first and second on-die termination circuits 150 and 160 having the ground termination form and the CTT form, respectively. For example, the code generator 130b may operate to generate the resistance calibration code (CODE<N-1:0>) of the first on-die termination circuit 150 with the ground termination form in response to the first calibration signal (CAL_term1) and generate the resistance calibration code (CODE<N-1:0>) of the second on-die termination circuit 160 with the CTT form in response to the second calibration signal (CAL_term2). A configuration of the pull-down set 134b according to the exemplary embodiment of FIG. 12 will be described below with reference to FIG. 13.

Figure 13:
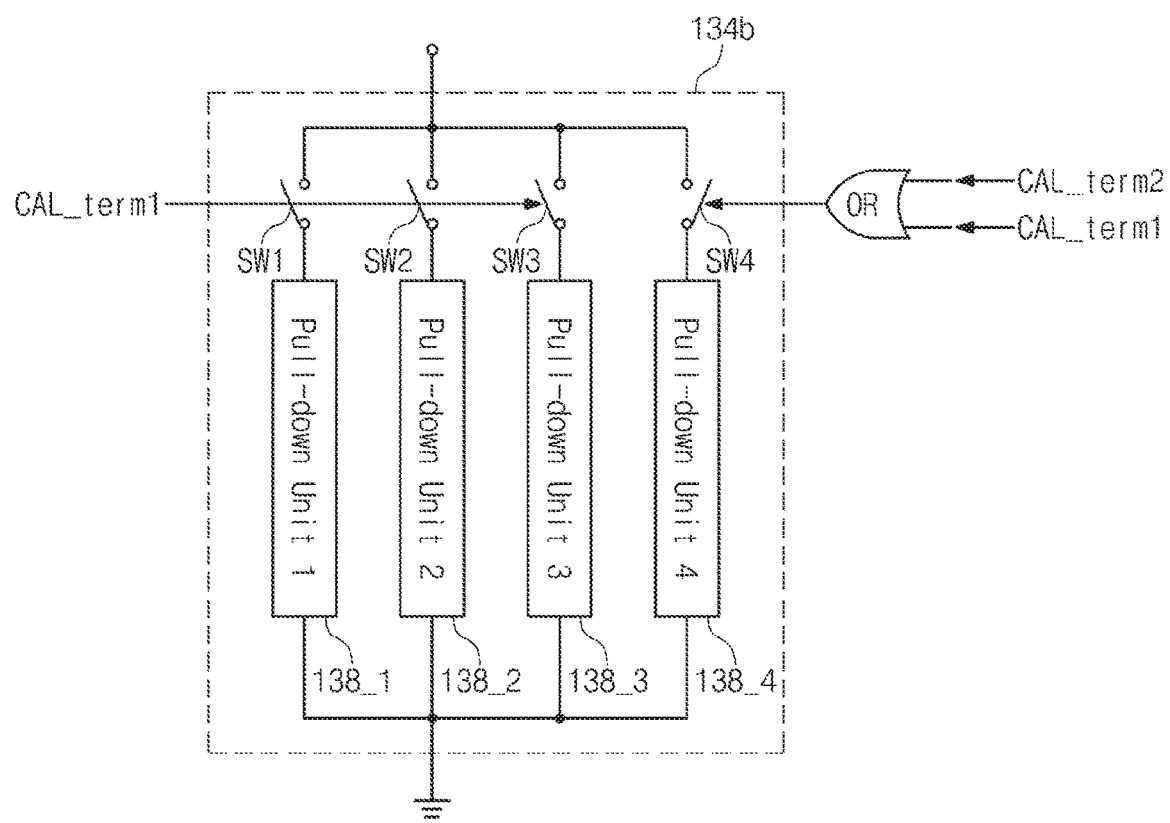
FIG. 13 is a circuit diagram illustrating a pull-down set of FIG. 12 according to an exemplary embodiment of the inventive concept.

FIG. 13 is a circuit diagram illustrating a pull-down set of FIG. 12 according to an exemplary embodiment of the inventive concept. Referring to FIG. 13, the pull-down set 134b may include first through fourth pull-down units (138_1 to 138_4), first through fourth switches (SW1 to SW4), and an OR logic. Since a configuration and operation of the first through fourth pull-down units (138_1 to 138_4) are the same or substantially the same as that of the pull-down set 134a of FIG. 8, a description thereof is omitted.

The first through fourth pull-down units (138_1 to 138_4) are connected in series to the first through fourth switches (SW1 to SW4), respectively. The first through third switches (SW1 to SW3) may be turned on or off by the first calibration signal (CAL_term1). The fourth switch SW4 may be turned on or off by an output value of the OR logic. The OR logic outputs a value obtained by performing a logical OR operation on the first and second calibration signals (CAL_term1, CAL_term2). Consequently, all of the first through fourth pull-down units (138_1 to 138_4) are activated to operate in response to the first calibration signal (CAL_term1). In the case where the first calibration signal (CAL_term1) is deactivated, only the fourth pull-down unit (138_4) is activated in response to the second calibration signal (CAL_term2).

Figure 14:
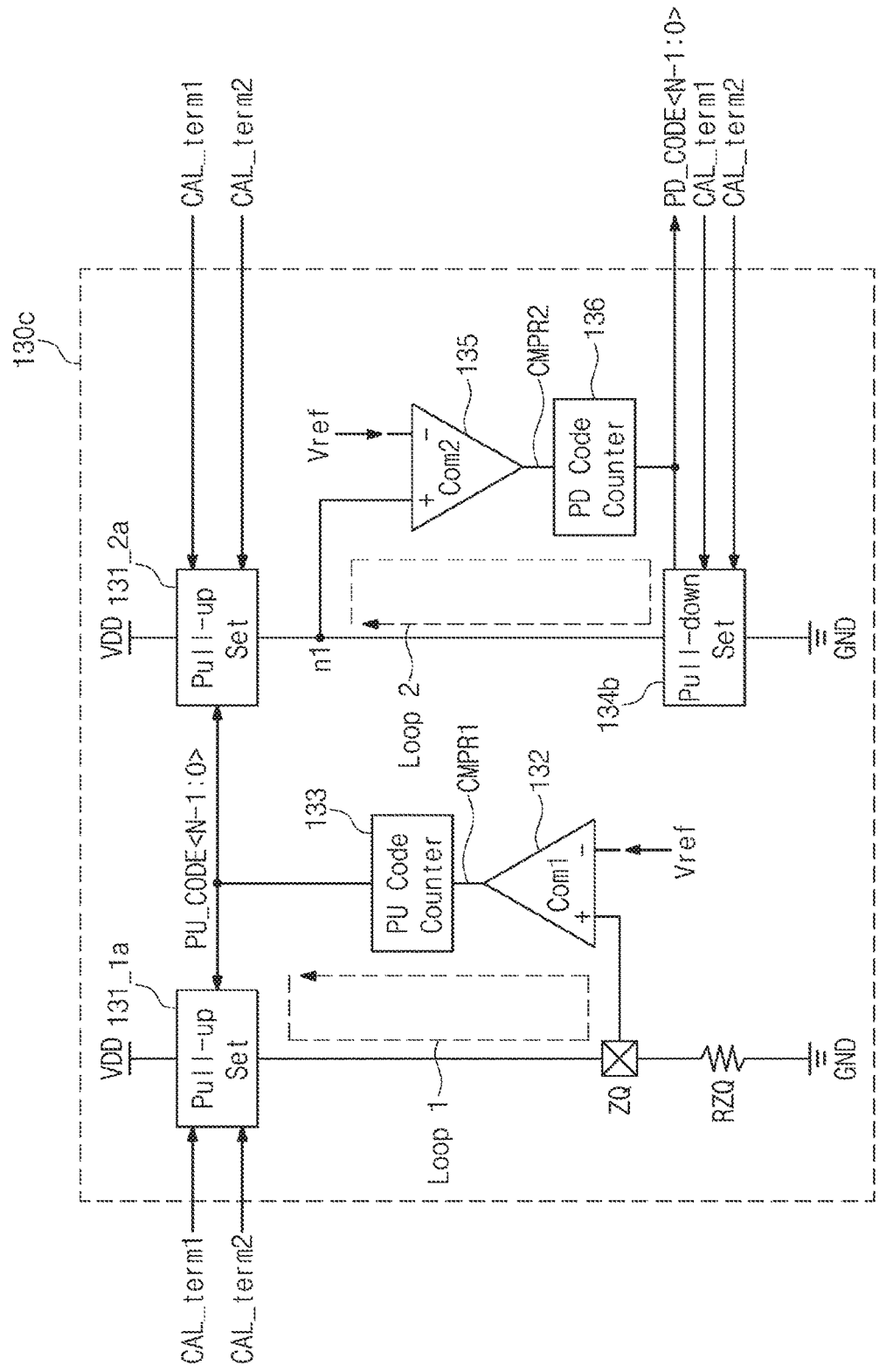
FIG. 14 is a block diagram illustrating a code generator according to an exemplary embodiment of the inventive concept.

FIG. 14 is a block diagram illustrating a code generator according to an exemplary embodiment of the inventive concept. Referring to FIG. 14, a code generator 130c may include the first pull-up set 131_1a, the first comparator 132, the pull-up code counter 133, the second pull-up set 131_2a, the pull-down set 134b, the second comparator 135, and the pull-down code counter 136. A configuration and operation of the code generator 130c of FIG. 14 is the same or substantially the same as that of the code generator 130a of FIG. 5, except that the first and second pull-up sets (131_1a, 131_2a) and the pull-down set 134b are all controlled by the first and second calibration signals (CAL_term1, CAL_term2). Thus, a detailed description of similar elements is omitted.

The code generator 130c may generate the resistance calibration code (CODE<N-1:0>) with respect to the first and second on-die termination circuits 150 and 160 having the POD form, the CTT form, or the ground termination form. Since this operation is similar to that described with reference to FIGS. 1 through 13, a description thereof is omitted. As described above, the pull-up target resistance value and the pull-down target resistance value may be different depending on the termination form. Accordingly, a configuration of the voltage generator 120 may vary.

Figure 15:
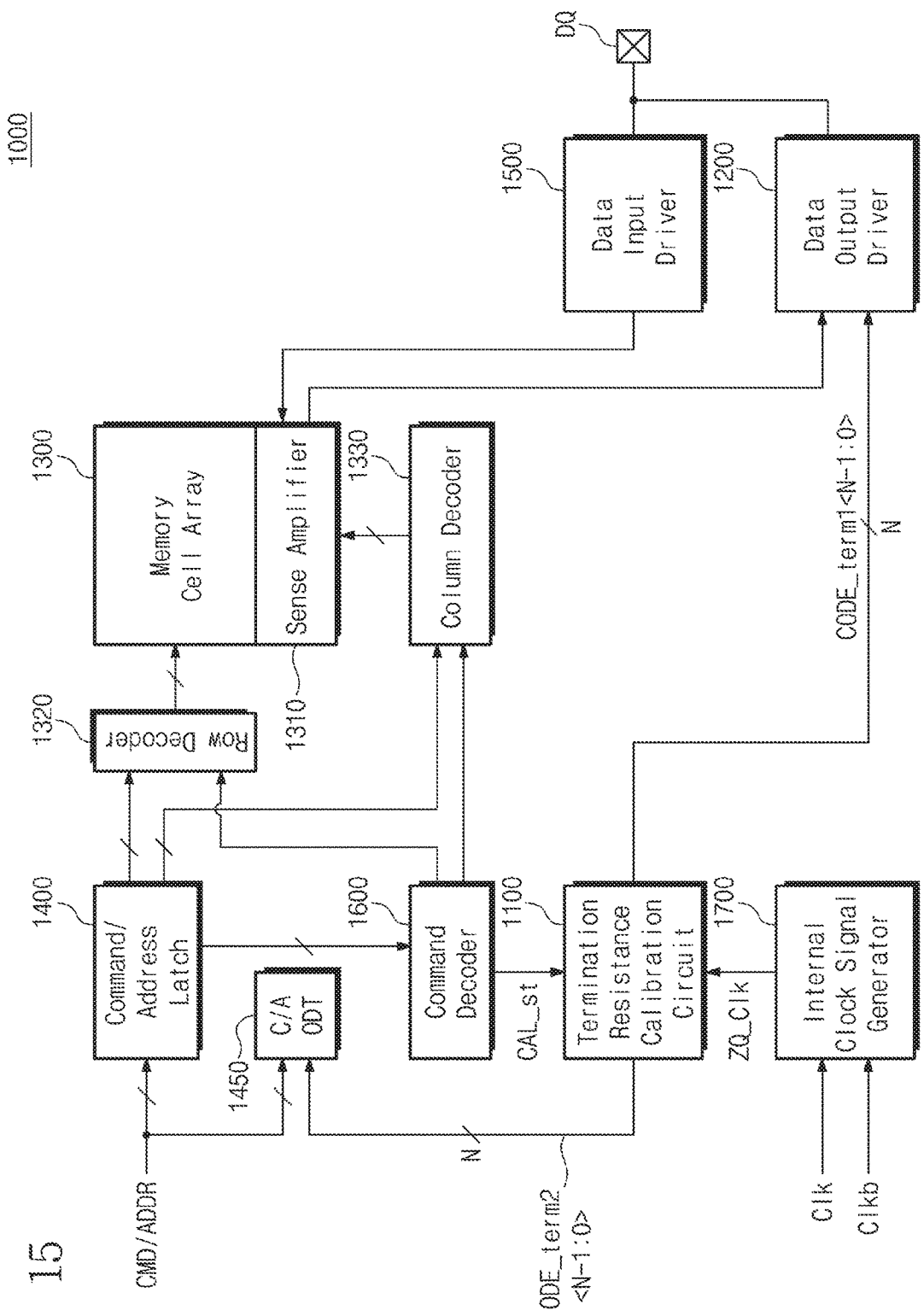
FIG. 15 is a block diagram illustrating a memory device including a termination resistance calibration circuit according to an exemplary embodiment of the inventive concept.

FIG. 15 is a block diagram illustrating a memory device including a termination resistance calibration circuit according to an exemplary embodiment of the inventive concept. A memory device 1000 of FIG. 15 may include a volatile memory device or a nonvolatile memory device.

For example, in the case where the memory device 1000 is a volatile memory, the memory device 1000 may be a dynamic random access memory (DRAM), a static random access memory (SRAM), a thyristor RAM (TRAM), a zero capacitor RAM (Z-RAM), a twin transistor RAM (TTRAM), or a magnetic RAM (MRAM).

For example, in the case where the memory device 1000 is a nonvolatile memory, the memory device 1000 may be an EEPROM (electrically erasable programmable read-only memory), a flash memory, a MRAM (magnetic random access memory), a spin-transfer torque MRAM, a CBRAM (conductive bridging RAM), a FeRAM (ferroelectric RAM), a PRAM (phase change RAM) a RRAM (resistive RAM), a nanotube RRAM, a PoRAM (polymer RAM), a NFGM (nanotube floating gate memory), a holographic memory, a molecular electronics memory device, or an insulator resistance change memory.

The memory device 1000 may include a termination resistance calibration circuit 1100, a data output driver 1200, a memory cell array 1300, a sense amplifier 1310, a row decoder 1320, a column decoder 1330, a command/address latch 1400, a command/address termination circuit 1450, a data input driver 1500, a command decoder 1600, and an internal clock signal generator 1700.

The termination resistance calibration circuit 1100 may perform a calibration operation for matching a termination resistance value with a target resistance value. For example, the termination resistance calibration circuit 1100 may correspond to the termination resistance calibration circuit 100 of FIG. 1. The termination resistance calibration circuit 1100, according to an exemplary embodiment of the inventive concept, may generate the first resistance calibration code (CODE_term1<N-1:0>) and the second resistance calibration code (CODE_term2<N-1:0>). The termination resistance value may be matched with the target resistance value by the generated first resistance calibration code (CODE_term1<N-1:0>) and the generated second resistance calibration code (CODE_term2<N-1:0>). The first resistance calibration code (CODE_term1<N-1:0>) may be provided to the data output driver 1200 and the second resistance calibration code (CODE_term2<N-1:0>) may be provided to the command/address termination circuit 1450. According to an exemplary embodiment of the inventive concept, the command/address termination circuit 1450 may be included in the command/address latch 1400.

The data output driver 1200 may output data stored in the memory cell array 1300 to the outside of the memory device 1000 through a DQ pad. The data stored in the memory cell array 1300 may be provided to the data output driver 1200 through the sense amplifier 1310. In this case, the row decoder 1320 and the column decoder 1330 may provide an address ADDR of a memory cell of the memory cell array 1330, in which data to be output is stored. The address ADDR of the memory cell may be provided to the row decoder 1320 and the column decoder 1330 through the command/address latch 1400.

Data from outside of the memory device 1000 may be provided to the data input driver 1500 through the DQ pad. In this case, the data output driver 1200 may operate as an on-die termination circuit. The data provided to the data input driver 1500 may be stored in the memory cell array 1300 through the sense amplifier 1310. The address ADDR of a memory cell, in which the data from outside of the memory device 1000 is to be stored, may be provided to the memory cell array 1300 through the command/address latch 1400, the row decoder 1320, and the column decoder 1330.

The command decoder 1600 receives various commands CMD through the command/address latch 1400. The command decoder 1600 provides commands to constituent elements such as the row decoder 1320, the column decoder 1330, etc. The command decoder 1600 may provide the calibration start signal (CAL_st) to the termination resistance calibration circuit 1100. The calibration start signal (CAL_st) may be a ZQCL (ZQ calibration long) command or a ZQCS (ZQ calibration short) command.

The internal clock signal generator 1700 may generate an internal clock signal in response to an external clock signal (CLK, CLKb). The termination resistance calibration circuit 1100 may perform a calibration operation in synchronization with the calibration clock signal (ZQ_clk) generated by the internal clock signal generator 1700.

According to exemplary embodiments of the inventive concept, as described above, a termination resistance calibration circuit may generate a calibration code for calibrating a termination resistance with respect to a heterogeneous on-die termination circuit. Accordingly, a semiconductor memory device may use the heterogeneous on-die termination circuit with respect to a data input buffer and a command/address buffer. Thus, quality of a data signal and a command/address signal may be enhanced.

While the inventive concept has been shown and described with reference to exemplary embodiments thereof, it will be apparent to those of ordinary skill in the art that various substitutions, modifications, and changes may be made (hereto without departing from the scope and spirit of the present inventive concept as defined by the following claims.

What is claimed is:

1. A memory device comprising:
 a first on-die termination circuit corresponding to a data input buffer;
 a second on-die termination circuit corresponding to a command/address buffer;
 a voltage generator configured to generate a reference voltage in response to a calibration signal; and
 a code generator configured to generate a resistance calibration code of a selected one of the first and second on-die termination circuits in response to the reference voltage,
 wherein the resistance calibration code calibrates a resistance value of the selected on-die termination circuit, and
 the calibration signal determines the selected on-die termination circuit.

2. The memory device of claim 1, wherein each of the first and second on-die termination circuits has a center tap termination (CTT) form, a pseudo open drain (POD) form, or a ground termination form.

3. The memory device of claim 1, wherein the code generator comprises:
a first pull-up resistance set having a resistance value determined according to a pull-up resistance calibration code included in the resistance calibration code;
a resistor for dividing a drive voltage together with the first pull-up resistance set to generate a first comparison voltage;
a pull-up code counter configured to calibrate the pull-up resistance calibration code using a comparison result between the first comparison voltage and the reference voltage;
a second pull-up resistance set having a resistance value determined according to the pull-up resistance calibration code;
a pull-down resistance set having a resistance value determined according to a pull-down resistance calibration code included in the resistance calibration code, the pull-down resistance set for dividing the drive voltage together with the second pull-up resistance set to generate a second comparison voltage; and
a pull-down code counter configured to calibrate the pull-down resistance calibration code using a comparison result between the second comparison voltage and the reference voltage.

4. The memory device of claim 3, wherein each of the first and second pull-up resistance sets comprises a plurality of pull-up resistance units connected in parallel, wherein resistance values of the pull-up resistance units are determined according to the pull-up resistance calibration code.

5. The memory device of claim 4, wherein each of the first and second pull-up resistance sets selects a portion of the plurality of pull-up resistance units, in response to a control signal, for operation, and
wherein resistance values of the pull-up resistance units correspond to a resistance value of the first on-die termination circuit or the second on-die termination circuit.

6. The memory device of claim 3, wherein the pull-down resistance set comprises a plurality of pull-down resistance units connected in parallel, wherein resistance values of the pull-down resistance units are determined according to the pull-down resistance calibration code.

7. The memory device of claim 6, wherein the pull-down resistance set selects a portion of the plurality of pull-down resistance units, in response to a control signal, for operation, and
wherein resistance values of the pull-down resistance units correspond to a resistance value of the first on-die termination circuit or the second on-die termination circuit.

8. The memory device of claim 1, further comprising a code register configured to receive the resistance calibration code and divide the resistance calibration code into a first resistance calibration code for the first on-die termination circuit and a second resistance calibration code for the second on-die termination circuit in response to the control signal.

9. The memory device of claim 8, wherein the code register comprises:
a first latch array configured to store the first resistance calibration code in response to the control signal;
a second latch array configured to store the second resistance calibration code in response to the control signal;
a third latch array configured to update a calibration code stored therein with the first resistance calibration code, after the code generator generates the first and second resistance calibration codes; and
a fourth latch array configured to update a calibration code stored therein with the second resistance calibration code, after the code generator generates the first and second resistance calibration codes.

10. The memory device of claim 9, wherein each of the first through fourth latch arrays comprises N latches and N corresponds to the number of bits of the resistance calibration code.

11. The memory device of claim 1, further comprising a control circuit configured to generate a control signal for selecting the first on-die termination circuit or the second on-die termination circuit in response to a clock signal,
wherein the control signal determines a first operation time of the voltage generator and the code generator for generating the resistance calibration code of the first on-die termination circuit or a second operation time of the voltage generator and the code generator for generating the resistance calibration code of the second on-die termination circuit.

12. A method of generating a resistance calibration code of a memory device for calibrating resistance values of first and second on-die termination circuits, the method comprising:
generating, at a code generator, a first resistance calibration code for the first on-die termination circuit;
changing, at the code generator and a voltage generator, a first generation condition of the resistance calibration code to a second generation condition of the resistance calibration code for the second on-die termination circuit; and
generating, at the code generator, a second resistance calibration code for the second on-die termination circuit using the second generation condition.

13. The method of claim 12, wherein changing the first generation condition of the resistance calibration code changes a level of the reference voltage and a configuration of a pull-up resistance set or a pull-down resistance set included in the code generator to correspond to the second on-die termination circuit.

14. The method of claim 12, wherein generating the first resistance calibration code and generating the second resistance calibration code are performed for substantially the same period of time.

15. The method of claim 12, wherein each of the first and second on-die termination circuits has a center tap termination (CTT) form, a pseudo open drain (POD) form, or a ground termination form.

16. A termination resistance calibration circuit of a memory device, comprising:
a first on-die termination circuit configured to operate in response to a first resistance calibration code;
a second on-die termination circuit configured to operate in response to a second resistance calibration code;
a control circuit configured to generate an update signal, a first calibration signal, and a second calibration signal in response to a calibration clock signal and a calibration start signal;
a voltage generator configured to generate a reference voltage in response to the first calibration signal and the second calibration signal;
a code generator configured to generate a resistance calibration code in response to the reference voltage; and a code register configured to generate the first resistance calibration code and the second resistance calibration code in response to the resistance calibration code, the first calibration signal, the second calibration signal, and the update signal, wherein the code generator comprises:
- a first pull-up set connected to a first node;
- a second pull-up set connected to a second node and the first pull-up set;
- a pull-down set connected between the second node and ground;
- a first comparator configured to compare a first voltage of the first node and the reference voltage; and
- a second comparator configured to compare a second voltage of the second node and the reference voltage.

17. The termination resistance calibration circuit of claim 16, wherein the first pull-up set and the second pull-up set are each controlled by the first calibration signal and the second calibration signal, the first pull-up set performs a resistance-dividing operation on a drive voltage to provide the first voltage to the first node, and the second pull-up set and the pull-down set performs a resistance-dividing operation on the drive voltage to provide the second voltage to the second node.

18. The termination resistance calibration circuit of claim 16, wherein the pull-down set is controlled by the first calibration signal and the second calibration signal, the first on-die termination circuit has a ground termination form, and the second on-die termination circuit has a center tap termination (CTT) form.

19. The termination resistance calibration circuit of claim 16, wherein the first pull-up set, the second pull-up set, and the pull-down set are each controlled by the first calibration signal and the second calibration signal, the first pull-up set, the first comparator, and a pull-up code counter form a first loop to a generate a first pull-up code, and the first loop is run until a termination resistance matches a first target resistance value, and the second pull-up set, the pull-down set, the second comparator, and a pull-down code counter form a second loop, and the second loop is run until an equivalent resistance value of the pull-down set matches a second target resistance value.

20. The termination resistance calibration circuit of claim 16, wherein the first pull-up set comprises:

- a plurality of pull-up units connected in parallel, wherein each pull-up unit comprises N number of transistors and N is the number of bits in the resistance calibration code;
- a plurality of switches each configured to be activated by the first calibration signal and connected to one of the plurality of pull-up units; and
- a logic gate configured to output a signal in response to the first calibration signal and the second calibration signal, wherein the logic gate activates one of the plurality of switches.

* * * * *